United States Patent
Ukai

(10) Patent No.: US 9,741,397 B2
(45) Date of Patent: Aug. 22, 2017

(54) SEMICONDUCTOR MEMORY DEVICE

(71) Applicant: Rohm Co., Ltd., Kyoto (JP)

(72) Inventor: Kazuhisa Ukai, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 14/632,413

(22) Filed: Feb. 26, 2015

(65) Prior Publication Data

US 2015/0170713 A1 Jun. 18, 2015

Related U.S. Application Data

(62) Division of application No. 13/368,611, filed on Feb. 8, 2012, now Pat. No. 9,001,562.

(30) Foreign Application Priority Data

Feb. 8, 2011 (JP) .................................. 2011-24857

(51) Int. Cl.
*G11C 11/24* (2006.01)
*G11C 5/02* (2006.01)
(Continued)

(52) U.S. Cl.
CPC ............... *G11C 5/025* (2013.01); *G11C 7/06* (2013.01); *G11C 7/14* (2013.01); *G11C 11/412* (2013.01); *G11C 29/1201* (2013.01); *H01L 27/0207* (2013.01); *H01L 27/105* (2013.01); *H01L 27/10894* (2013.01); *H01L 27/10897* (2013.01); *H01L 27/1104* (2013.01); *H01L 27/1116* (2013.01); *G11C 11/4099* (2013.01)

(58) Field of Classification Search
CPC .. G11C 5/025; G11C 7/14; G11C 7/06; G11C 11/412; G11C 11/4099; H01L 27/1104; H01L 27/10897; H01L 27/0207; H01L 27/105; H01L 27/10894; H01L 27/1116
See application file for complete search history.

(56) References Cited

U.S. PATENT DOCUMENTS 6,480,407 B1 11/2002 Keeth
2003/0021140 A1 1/2003 Morihara et al.
(Continued)

FOREIGN PATENT DOCUMENTS

| CN | 1615527 | 5/2005 |
| CN | 101207129 | 6/2008 |

(Continued)

OTHER PUBLICATIONS

Office Action for Chinese Patent Application No. CN201210027558.X dated Jun. 10, 2015 (with English translation).

*Primary Examiner* — Pho M Luu
*Assistant Examiner* — Mohammed A Bashar
(74) *Attorney, Agent, or Firm* — Fish & Richardson P.C.

(57) ABSTRACT

A semiconductor memory device includes a memory array including a plurality of element blocks, the plurality of element blocks including end-portion element blocks arranged at an end portion of the memory array, and at least one dummy block disposed adjacent to the end-portion element blocks, the at least one dummy block being not in practical use. A layout pattern of the at least one dummy block is configured to correspond to only a portion of a layout pattern of the plurality of element blocks.

7 Claims, 14 Drawing Sheets

(51) Int. Cl.

| | |
|---|---|
| *G11C 11/412* | (2006.01) |
| *G11C 29/12* | (2006.01) |
| *H01L 27/02* | (2006.01) |
| *H01L 27/105* | (2006.01) |
| *H01L 27/108* | (2006.01) |
| *H01L 27/11* | (2006.01) |
| *G11C 7/06* | (2006.01) |
| *G11C 7/14* | (2006.01) |
| *G11C 11/4099* | (2006.01) |

(56) References Cited

U.S. PATENT DOCUMENTS

2008/0151606 A1  6/2008  Kurumada et al.
2010/0008120 A1* 1/2010  Shimosako ........... G11C 11/417
                                              365/51

FOREIGN PATENT DOCUMENTS

| JP | 2001-068635 | 3/2001 |
|---|---|---|
| JP | 3922712 | 5/2007 |

* cited by examiner

SEMICONDUCTOR MEMORY DEVICE

CROSS-REFERENCE TO RELATED APPLICATION

This application is a divisional of U.S. patent application Ser. No. 13/368,611 filed Feb. 8, 2012, which claims the benefit of priority from Japanese Patent Application No. 2011-24857, filed on Feb. 8, 2011, the entire contents of which are incorporated herein by reference.

TECHNICAL FIELD

The present disclosure relates to a design of pattern of a semiconductor memory device including a memory-mounted LSI (Large Scale Integrated Circuit).

BACKGROUND

FIG. 12 is a schematic view showing a conventional layout pattern of an end portion of a memory array. As shown in FIG. 12, in a conventional semiconductor memory device, in order to prevent a density difference of a mask pattern (further a characteristic variation due to the density difference) from being generated as far as possible between element blocks A (a group of transistors forming memory cells, sense amplifiers and so on) which are arranged in an end portion of the memory array (a portion adjacent to a peripheral perimeter of the memory array) and element blocks B (a group of transistors forming memory cells, sense amplifiers and so on, like the element blocks A) which are not arranged in the end portion of the memory array, dummy blocks D1 and D2 which are not in practical use are provided adjacent to the element blocks A.

However, the conventional semiconductor memory device has a problem of unnecessary increase in an area of the memory array since each of the dummy blocks D1 and D2 has the same size as the element block A. In particular, as shown in FIG. 13, if a plurality of divided memory arrays is arranged, this problem becomes more remarkable since an area of the dummy blocks D1 and D2 increases with an increase in the area of end portions of the memory arrays.

SUMMARY

The present disclosure provides some embodiments of a semiconductor memory device which is capable of reducing a characteristic variation due to a density difference of a mask pattern without unnecessarily increasing an area of a memory array.

According to one embodiment of the present disclosure, a semiconductor memory device includes a memory array including a plurality of element blocks, the plurality of element blocks including end-portion element blocks arranged at an end portion of the memory array, and at least one dummy block disposed adjacent to the end-portion element blocks, the at least one dummy block being not in practical use. A layout pattern of the at least one dummy block is configured to correspond to only a portion of a layout pattern of the plurality of element blocks.

In one embodiment, each of the plurality of element block is a memory cell including a select transistor and a capacitor, a contact wiring of the capacitor extends to a position spaced by a predetermined distance from the end portion of the memory array, and the at least one dummy block includes a dummy gate formed by extending a gate of the select transistor to a position spaced from the end portion of the memory array by the predetermined distance at a maximum.

In one embodiment, each of the plurality of element blocks is a sense amplifier or a memory cell including 6 transistors arranged in the form of a lattice and the at least one dummy block is configured to correspond to a layout pattern of transistors arranged in one row or one column of the lattice adjacent to the dummy block.

In one embodiment, the at least one dummy block has a layout pattern designed to have a line symmetry relationship with the portion of the layout pattern of the plurality of element block with a boundary line between the at least one dummy block and the plurality of element blocks as a symmetrical axis.

In one embodiment, the memory array includes a plurality of divided memory arrays.

In one embodiment, each of the plurality of the element block is a sense amplifier or a memory cell including 6 transistors arranged in the form of a lattice and the at least one dummy block is configured to correspond to a layout pattern of gates of transistors arranged in one row or one column of gates the lattice adjacent to the dummy block.

DETAILED DESCRIPTION

Figure 1:
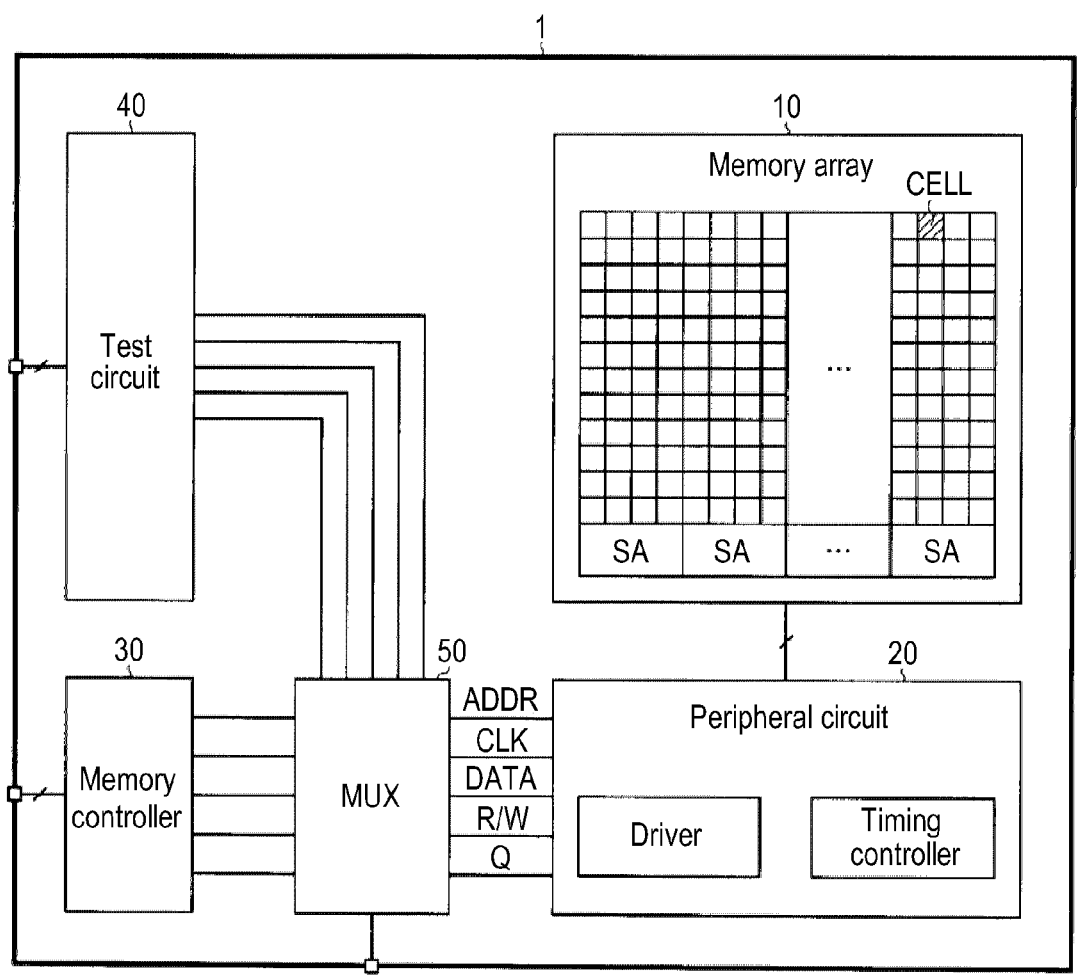
FIG. 1 is a block diagram showing one embodiment of a semiconductor memory device.

Various embodiments are now described with reference to the drawings, wherein like reference numerals are used to refer to like elements throughout. In the following description, for purposes of explanation, numerous specific details are set forth in order to provide a thorough understanding of one or more embodiments. It may be evident, however, that such embodiment(s) may be practiced without these specific details. In other instances, well-known structures and devices are shown in block diagram forms in order to facilitate describing one or more embodiments.

<Block Diagram>

FIG. 1 is a block diagram showing one embodiment of a semiconductor memory device. A semiconductor memory device of this embodiment includes a memory array 10, a peripheral circuit 20, a memory controller 30, a test circuit 40 and a multiplexer 50.

The memory array 10 includes a plurality of memory cells CELL and sense amplifiers SA arranged in a form of an array. The memory cells may employ dynamic RAMs (DRAMs), 6T-SRAMs and so on.

The peripheral circuit 20 performs access control of the memory array 10 and output control of an output signal Q based on an address signal ADDR, a clock signal CLK, a data signal DATA and a read/write select signal R/W, which are input from the memory controller 30 or the test circuit 40 via the multiplexer 50. The peripheral circuit 20 includes a driver which generates various driving signals required for a read/write operation of the memory array 10, and a timing controller.

Based on an instruction from a host device (e.g., a central processing unit (CPU)) provided at the outside of the semiconductor memory device 1, the memory controller 30 generates the address signal ADDR, the clock signal CLK, the data signal DATA and the read/write select signal R/W, outputs these signals to the peripheral circuit 20 via the multiplexer 50, and transfers the output signal Q, which is input from the peripheral circuit 20 via the multiplexer 50, to the host device.

Based on an instruction from a test device provided at the outside of the semiconductor memory device 1, the test circuit 40 generates the address signal ADDR, the clock signal CLK, the data signal DATA and the read/write select signal R/W for test, outputs these signals to the peripheral circuit 20 via the multiplexer 50, and transfers the output signal Q, which is input from the peripheral circuit 20 via the multiplexer 50, to the test device.

Based on a test enable signal input from the outside of the semiconductor memory device 1, the multiplexer 50 determines which of the memory controller 30 and the test circuit 40 is to be connected to the peripheral circuit 20.

<DRAM>

Figure 2:
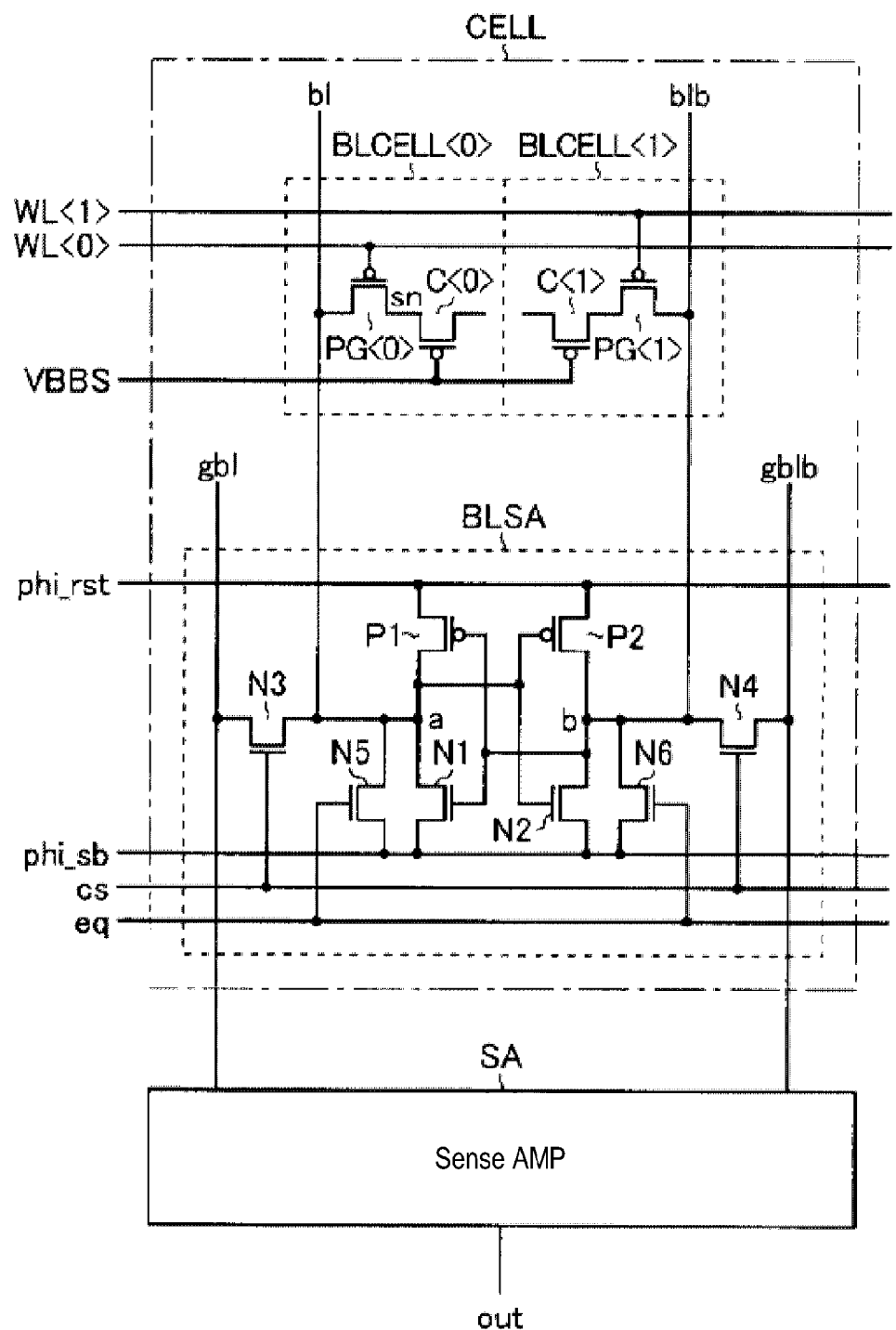
FIG. 2 is a circuit diagram showing a DRAM according to an embodiment.

FIG. 2 is a circuit diagram showing DRAM according to an embodiment. In FIG. 2, the DRAM corresponds to a memory cell unit CELL including an array of DRAM type memory cells BLCELL<k> (k=0, 1, . . . ) and a 6T-SRAM type local sense amplifier BLSA.

Each memory cell BLCELL<k> includes a select transistor PG<k> (a P-channel MOSFET (Metal Oxide Semiconductor Field Effect Transistor)) and a capacitor C<k> (gate capacitor of the P-channel MOSFET). The capacitor C<k> has a first end (sense node sn) connected to a first local bit line bl or a second local bit line blb via the select transistor PG<k>, and a second end (gate of the transistor) connected to a terminal of a reference voltage VBBS. A gate of the select transistor PG<k> is connected to a word line WL<k>.

In FIG. 2, the local sense amplifier BLSA includes P-channel MOSFETs P1 and P2 and N-channel MOSFETs N1 to N6. Sources of the transistors P1 and P2 are both connected to a signal line phi_rst, which corresponds to a PMOS driving signal line. Sources of the transistors N1 and N2 are both connected to a signal line phi_sb, which corresponds to a NMOS driving signal line.

Further, a drain of the transistor P1 and a drain of the transistor N1 are interconnected at a connection node a. The connection node a is connected to the first local bit line bl, to a first global bit line gbl via the transistor N3, to the signal line phi_sb via the transistor N5, and to both gates of the transistors P2 and N2. A gate of the transistor N3 is connected to a signal line cs (cell select signal line), and a gate of the transistor N5 is connected to a signal line eq, which is a pre-charge/equalizing signal line of the first local bit line bl and second local bit line blb.

A drain of the transistor P2 and a drain of the transistor N2 are interconnected at a connection node b. The connection node b is connected to the second local bit line blb, to a second global bit line gblb via the transistor N4, to the signal line phi_sb via the transistor N6, and to both gates of the transistors P1 and N1. A gate of the transistor N4 is connected to the signal line cs, and a gate of the transistor N6 is connected to the signal line eq.

Referring to FIG. 2, the local sense amplifier BLSA amplifies a weak output signal of the memory cell BLCELL (a voltage signal appearing on the first local bit line bl and the second local bit line blb), and outputs the amplified signal to the first global bit line gbl and the second global bit line gblb. In addition, the local sense amplifier BLSA writes data into the memory cell BLCELL<k> or refreshes the memory cell BLCELL<k>.

Although it is shown in FIG. 2 that one memory cell BLCELL is connected to each of the first local bit line bl and the second local bit line blb, a plurality of memory cells BLCELLs is, in actuality, connected to each of the first local bit line bl and the second local bit line blb.

In addition, although it is shown in FIG. 2 that only one memory cell BLCELL is connected between the first global bit line gbl and the second global bit line gblb, a plurality of memory cell units CELL is, in actuality, connected between the first global bit line gbl and the second global bit line gblb.

<Write Operation of Data "1">

Figure 3:
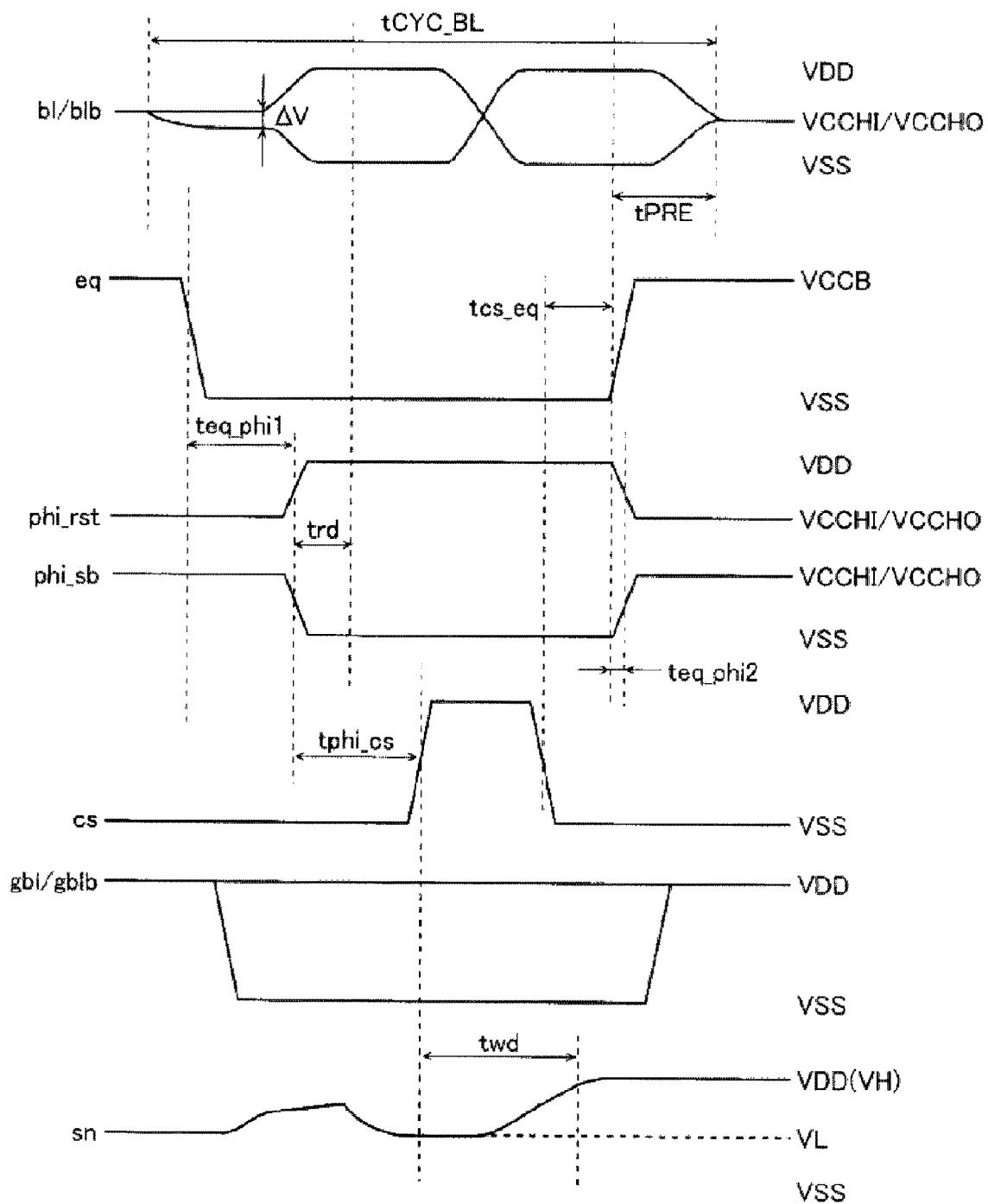
FIG. 3 is a timing chart for explaining a write operation of data "1".

FIG. 3 is a timing chart for explaining the write operation of data "1," showing a voltage waveform of each of the first local bit line bl/second local bit line blb, the signal line eq, the signal line phi_rst, the signal line phi_sb, the signal line cs, the first global bit line gbl/second global bit line gblb, and the sense node sn in order from the top.

Symbols regarding voltages in FIG. 3 will be described. VDD, VSS, VCCB, VCCHI and VCCHO denote a source voltage, a ground voltage, a high level voltage (HL) applied to the signal line eq, a pre-charge level voltage for local bit lines, and a pre-charge level voltage (for global bit lines, respectively. Here, the source voltage may be 1.2 V, the high level voltage may be 1.6 V, the pre-charge level voltage for local bit lines may be 0.73 V, and the pre-charge level voltage for global bit lines may be 0.71 V. ΔV is |bl−blb|.

Symbols regarding time in FIG. 3 will be described. Tcyc_BL denotes a driving cycle of a read/write operation. teq_phi1 denotes time taken until a voltage of the signal line phi_rst/phi_sb transitions to a high level/low level after a voltage of the signal line eq falls to a low level. trd denotes time taken until a voltage of the first local bit line bl/second local bit line blb is stabilized after the voltage of the signal line phi_rst/phi_sb transitions to the high level/low level. tphi_cs denotes time taken until a voltage of the signal line cs rises to a high level after the voltage of the signal line phi_rst/phi_sb transitions to the high level/low level. twd denotes time taken until a voltage of the sense node sn is stabilized after the voltage of the signal line cs rises to the high level. tcs_eq denotes time taken until a voltage of the signal line eq rises to a high level after the voltage of the signal line cs falls to a low level. teq_phi2 denotes time taken until the voltage of the signal line phi_rst/phi_sb transitions to the high level/low level after the voltage of the signal line eq rises to the high level. tPRE denotes time taken until the voltage of the first local bit line bl/second local bit line blb is pre-charged after the voltage of the signal line eq transitions to the high level.

An operation of overwriting of the data "1" on the memory cell BLCELL<0> in which the data "0" is already written will be described below with reference to FIG. 3. Since both of the transistors N5 and N6 remain turned on while the voltage of the signal line eq is at the high level, both of the first local bit line bl and the second local bit line blb make an electrical conduction with the signal line phi_sb, and are applied with a predetermined pre-charge voltage VCCHI.

Thereafter, since the select transistor PG<0> is turned on when the word line WL<0> has a low level, the sense node sn of the capacitor C<0> makes an electrical conduction with the first local bit line bl. In addition, since both of the transistors N5 and N6 are turned off when the signal line eq falls from the high level to the low level, the first local bit line bl and the second local bit line blb are separated from the signal line phi_sb and enter into a floating state.

At this time, a low voltage VL corresponding to the data "0" is applied to the sense node sn of the capacitor C<0>. Here, the low voltage VL may be 200 mV. Accordingly, due to a capacitance division of the capacitor C<0> and the first local bit line bl, a voltage decrease ΔV occurs in the first local bit line bl and a voltage increase occurs in the sense node sn of the capacitor C<0>. In the meantime, the voltage of the second local bit line blb remains at the pre-charge voltage VCCHI.

Thereafter, when the signal line phi_rst rises from the low level to the high level and the signal line phi_sb falls from the high level to the low level, the local sense amplifier BLSA enters into an active state. As a result, the voltage of the first local bit line bl can fall to the ground voltage VSS and the voltage of the second local bit line blb can rise to the source voltage VDD. That is, a voltage difference between the first local bit line bl and the second local bit line blb is amplified from ΔV to VDD−VSS by the local sense amplifier BLSA. At this time, the sense node sn of the capacitor C<0> returns to the low voltage VL corresponding to the data "0." In addition, before the local sense amplifier BLSA enters into the active state, the first global bit line gbl and the second global bit line gblb go to the high level and the low level, respectively, in preparation for the write operation of the data "1."

Thereafter, since both of the transistors N3 and N4 are turned on when the signal line cs rises from the low level to the high level, an electrical conduction is made between the first local bit line bl and the first global bit line gbl, and between the second local bit line blb and the second global bit line gblb. As a result, the voltage of the first local bit line bl may rise from the ground voltage VSS to the source voltage VDD and the voltage of the second local bit line blb may fall from the source voltage VDD to the ground voltage VSS. At this time, a high voltage VH, which is close to the VDD, corresponding to the data "1" is stored in the sense node of the capacitor C<0>.

Thereafter, since both of the transistors N3 and N4 are turned off when the signal line cs falls from the high level to the low level, an electrical isolation is made between the first local bit line bl and the first global bit line gbl, and between the second local bit line blb and the second global bit line gblb. In addition, when the signal lines phi_rst/phi_sb transition to the low level/high level, respectively, the local sense amplifier BLSA enters into an inactive state. In addition, since both of the transistors N5 and N6 are turned on when the signal line eq rises from the low level to the high level, both of the first local bit line bl and the second local bit line blb make an electrical conduction with the signal line phi_sb, and are applied with the predetermined pre-charge voltage VCCHI. In addition, both of the first global bit line gbl and the second global bit line gblb go to the high level in preparation for the pre-charging operation.

Through the series of above-described operations, the data "1" can be overwritten on the memory cell BLCELL<0> in which the data "0" is already written. In addition, although it has been illustrated in the above that the memory cell BLCELL<0> is selected for writing the data "1," the above-described operations may be equally applied to other selected memory cell BLCELL<k>, and if necessary, a relationship between the first local bit line bl and the second local bit line blb, and a relationship between the first global bit line gbl and the second global bit line gblb may be reversed.

<Write Operation of Data "0">

Figure 4:
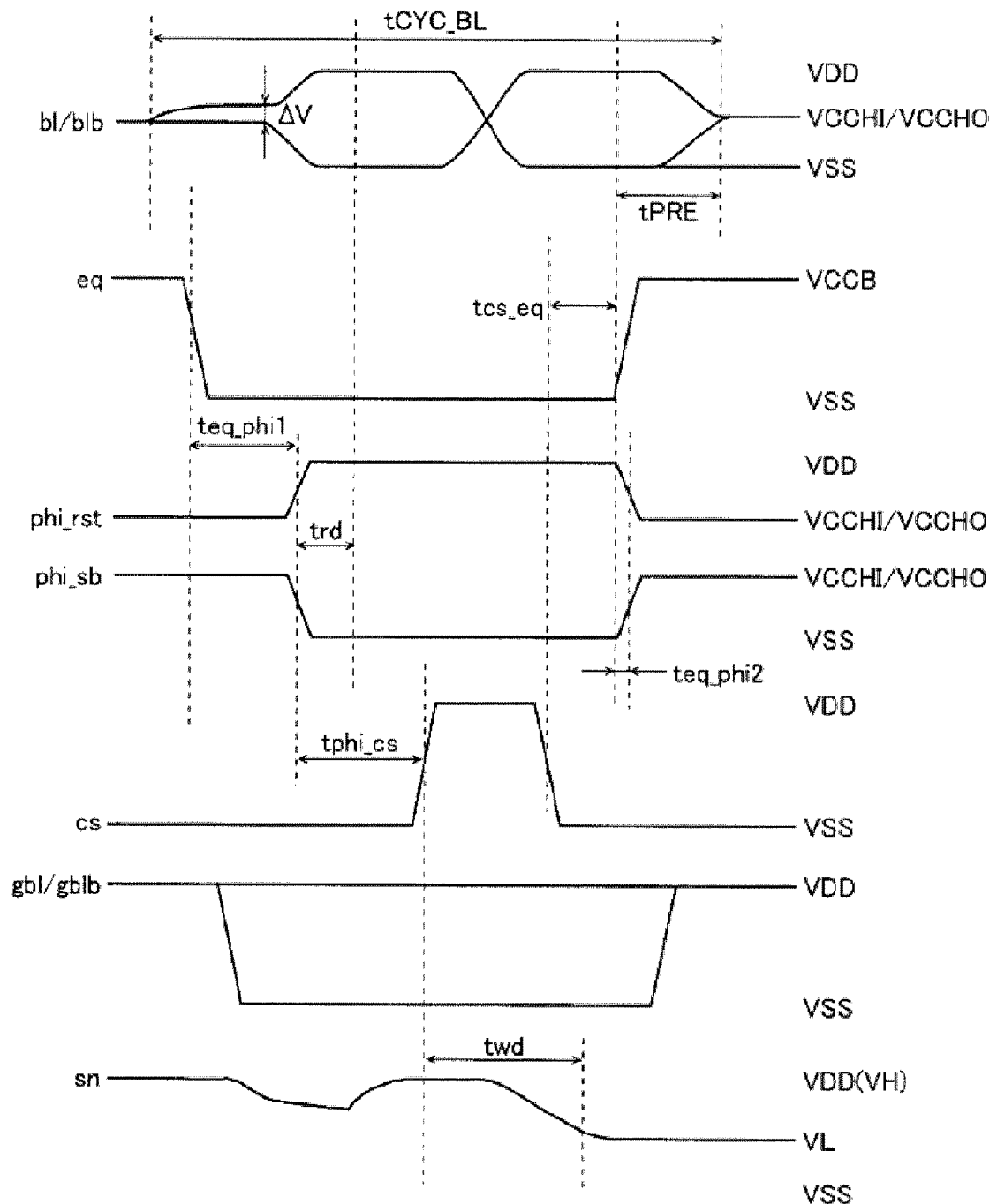
FIG. 4 is a timing chart for explaining a write operation of data "0".

FIG. 4 is a timing chart for explaining the write operation of the data "0," showing a voltage waveform of each of the first local bit line bl/second local bit line blb, the signal line eq, the signal line phi_rst, the signal line phi_sb, the signal line cs, the first global bit line gbl/second global bit line gblb, and the sense node sn in order from the top. Symbols regarding voltages and symbols regarding time in FIG. 4 are the same as those in FIG. 3, and therefore, an explanation thereof will not be repeated.

An operation of overwriting of the data "0" on the memory cell BLCELL<0> in which data "1" is already written will be described below with reference to FIG. 4. Since both of the transistors N5 and N6 remain turned on while the voltage of the signal line eq is at the high level, both of the first local bit line bl and the second local bit line blb make an electrical conduction with the signal line phi_sb and are applied with a predetermined pre-charge voltage VCCHI.

Thereafter, since the select transistor PG<0> is turned on when the word line WL<0> has a low level, the sense node sn of the capacitor C<0> makes an electrical conduction with the first local bit line bl. In addition, since both of the transistors N5 and N6 are turned off when the signal line eq falls from the high level to the low level, the first local bit line bl and the second local bit line blb are separated from the signal line phi_sb and enter into a floating state.

At this time, a high voltage VH, which is close to the VDD, corresponding to the data "1" is applied to the sense node sn of the capacitor C<0>. Accordingly, due to a capacitance division of the capacitor C<0> and the first local bit line bl, a voltage increase ΔV occurs in the first local bit line bl and a voltage decrease occurs in the sense node sn of the capacitor C<0>. In the meantime, the voltage of the second local bit line blb remains at the pre-charge voltage VCCHI.

Thereafter, when the signal line phi_rst rises from the low level to the high level and the signal line phi_sb falls from the high level to the low level, the local sense amplifier BLSA enters into an active state. As a result, the voltage of the first local bit line bl can rise to the source voltage VDD and the voltage of the second local bit line blb can fall to the ground voltage VSS. That is, a voltage difference between the first local bit line bl and the second local bit line blb is amplified from ΔV to VDD−VSS by the local sense amplifier BLSA. At this time, the sense node sn of the capacitor C<0> returns to the high voltage VH corresponding to the data "1." In addition, before the local sense amplifier BLSA enters the active state, the first global bit line gbl and the second global bit line gblb go to the high level and the low level, respectively, in preparation for the write operation of the data "0."

Thereafter, since both of the transistors N3 and N4 are turned on when the signal line cs rises from the low level to the high level, an electrical conduction is made between the first local bit line bl and the first global bit line gbl and between the second local bit line blb and the second global bit line gblb. As a result, the voltage of the first local bit line bl can fall from the source voltage VDD to the ground voltage VSS and the voltage of the second local bit line blb can rise from the ground voltage VSS to the source voltage VDD. At this time, a low voltage VL, which may be 200 mV, corresponding to the data "0" is stored in the sense node of the capacitor C<0>.

Thereafter, since both of the transistors N3 and N4 are turned off when the signal line cs falls from the high level to the low level, an electrical isolation is made between the first local bit line bl and the first global bit line gbl and between the second local bit line blb and the second global bit line gblb. In addition, when the signal lines phi_rst/phi_sb transition to the low level/high level, respectively, the local sense amplifier BLSA enters into an inactive state. In addition, since both of the transistors N5 and N6 are turned on when the signal line eq rises from the low level to the high level, both of the first local bit line bl and the second local bit line blb make an electrical conduction with the signal line phi_sb and are applied with the predetermined pre-charge voltage VCCHI. In addition, both of the first global bit line gbl and the second global bit line gblb go to the high level in preparation for the pre-charging operation.

Through the series of above-described operations, the data "0" can be overwritten on the memory cell BLCELL<0> in which the data "1" is already written. In addition, although it has been illustrated in the above that the memory cell BLCELL<0> is selected for writing the data "0," the above-described operations may be equally applied to other selected memory cell BLCELL<k>, and if necessary, a relationship between the first local bit line bl and the second local bit line blb and a relationship between the first global bit line gbl and the second global bit line gblb may be reversed.

<Read Operation of Data "0">

Figure 5:
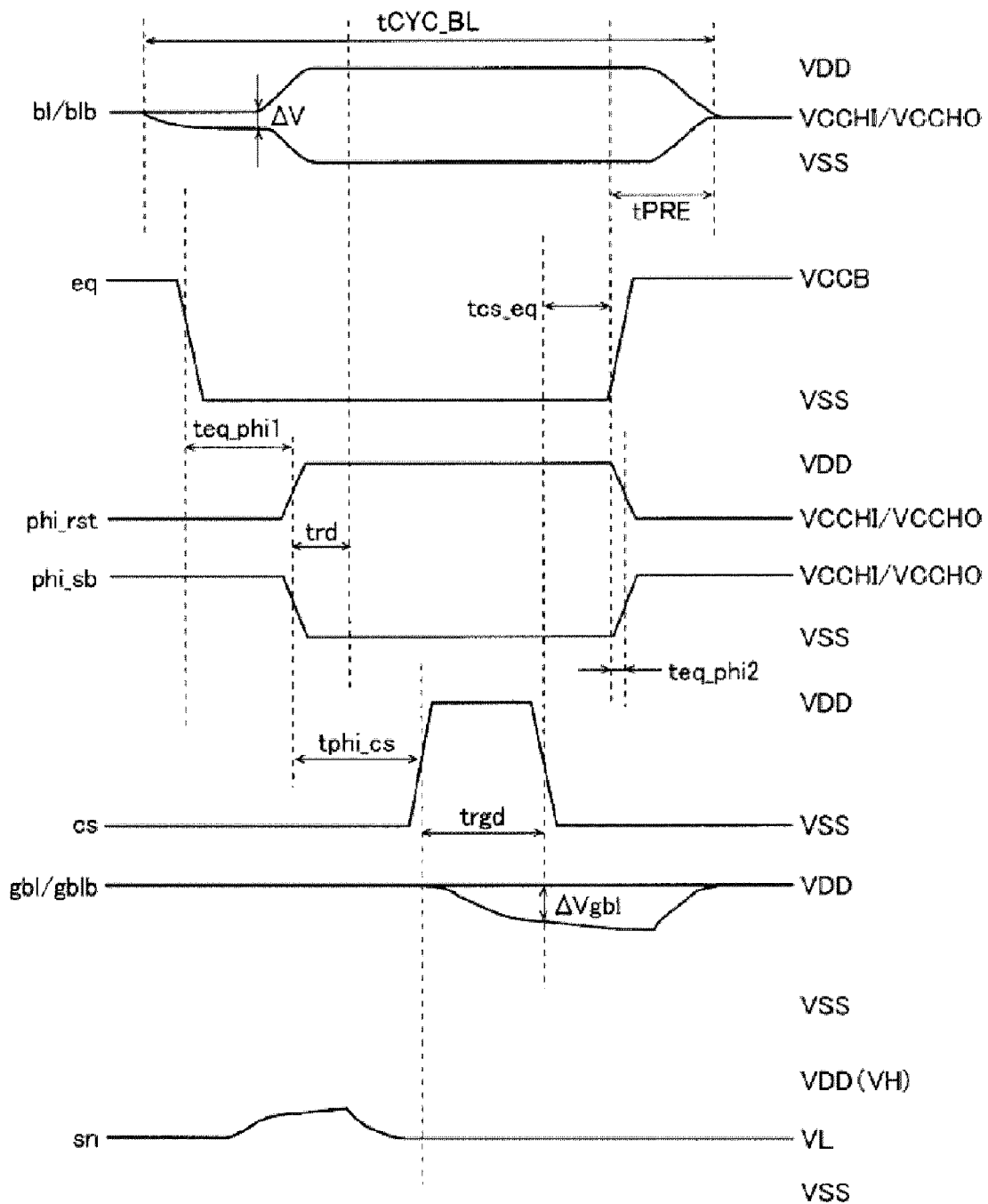
FIG. 5 is a timing chart for explaining a read operation of data "0".

FIG. 5 is a timing chart for explaining a read operation of the data "0," showing a voltage waveform of each of the first local bit line bl/second local bit line blb, the signal line eq, the signal line phi_rst, the signal line phi_sb, the signal line cs, the first global bit line gbl/second global bit line gblb, and the sense node sn in order from the top. Symbols regarding voltages and symbols regarding time in FIG. 5 are the same as those in FIGS. 3 and 4 except ΔVgbl and trgd, and therefore, an explanation of the same symbols will not be repeated. ΔVgbl is |gbl−gblb| and trgd denotes time taken until ΔVgbl reaches 120 mV after the signal line cs rises to the high level.

An operation of reading of the data "0" from the memory cell BLCELL<0> will be described below with reference to FIG. 5. Since both of the transistors N5 and N6 remain turned on while the voltage of the signal line eq is at the high level, both of the first local bit line bl and the second local bit line blb make an electrical conduction with the signal line phi_sb and are applied with a predetermined pre-charge voltage VCCHI.

Thereafter, since the select transistor PG<0> is turned on when the word line WL<0> has a low level, the sense node sn of the capacitor C<0> makes an electrical conduction with the first local bit line bl. In addition, since both of the transistors N5 and N6 are turned off when the signal line eq falls from the high level to the low level, the first local bit line bl and the second local bit line blb are separated from the signal line phi_sb and enter into a floating state.

At this time, a low voltage VL, which may be 200 mV, corresponding to the data "0" is applied to the sense node sn of the capacitor C<0>. Accordingly, due to a capacitance division of the capacitor C<0> and the first local bit line bl, a voltage decrease ΔV occurs in the first local bit line bl and a voltage increase occurs in the sense node sn of the capacitor C<0>. In the meantime, the voltage of the second local bit line blb remains at the pre-charge voltage VCCHI.

Thereafter, when the signal line phi_rst rises from the low level to the high level and the signal line phi_sb falls from the high level to the low level, the local sense amplifier BLSA enters into an active state. As a result, the voltage of the first local bit line bl can fall to the ground voltage VSS and the voltage of the second local bit line blb can rise to the source voltage VDD. That is, a voltage difference between the first local bit line bl and the second local bit line blb is amplified from ΔV to VDD−VSS by the local sense amplifier BLSA. At this time, the sense node sn of the capacitor C<0> returns to the low voltage VL corresponding to the data "0." In addition, both of the first global bit line gbl and the second global bit line gblb remain at the high level in preparation for the read operation of the data.

Thereafter, since both of the transistors N3 and N4 are turned on when the signal line cs rises from the low level to the high level, an electrical conduction is made between the first local bit line bl and the first global bit line gbl and between the second local bit line blb and the second global bit line gblb. As a result, the voltage of the first global bit line gbl decreases from the source voltage VDD by ΔVgbl. On the other hand, the voltage of the second local bit line blb remains at the source voltage VDD. Accordingly, as it is determined in the sense amplifier SA that the voltage of the first global bit line gbl is smaller than the voltage of the second global bit line gblb, the data "0" is read from the memory cell BLCELL<0>.

Thereafter, since both of the transistors N3 and N4 are turned off when the signal line cs falls from the high level to the low level, an electrical isolation is made between the first local bit line bl and the first global bit line gbl and between the second local bit line blb and the second global bit line gblb. In addition, when the signal lines phi_rst/phi_sb transition to the low level/high level, respectively, the local sense amplifier BLSA enters into an inactive state. In addition, since both of the transistors N5 and N6 are turned on when the signal line eq rises from the low level to the high level, both of the first local bit line bl and the second local bit line blb make an electrical conduction with the signal line phi_sb and are applied with the predetermined pre-charge voltage VCCHI. In addition, both of the first global bit line gbl and the second global bit line gblb go to the high level in preparation for the pre-charging operation.

Through the series of above-described operations, the data "0" can be read from the memory cell BLCELL<0>. In addition, although it has been illustrated in the above that the memory cell BLCELL<0> is selected for reading the data "0," the above-described operations may be equally applied to other selected memory cell BLCELL<k>, and if necessary, a relationship between the first local bit line bl and the second local bit line blb and a relationship between the first global bit line gbl and the second global bit line gblb may be reversed.

<Read Operation of Data "1">

Figure 6:
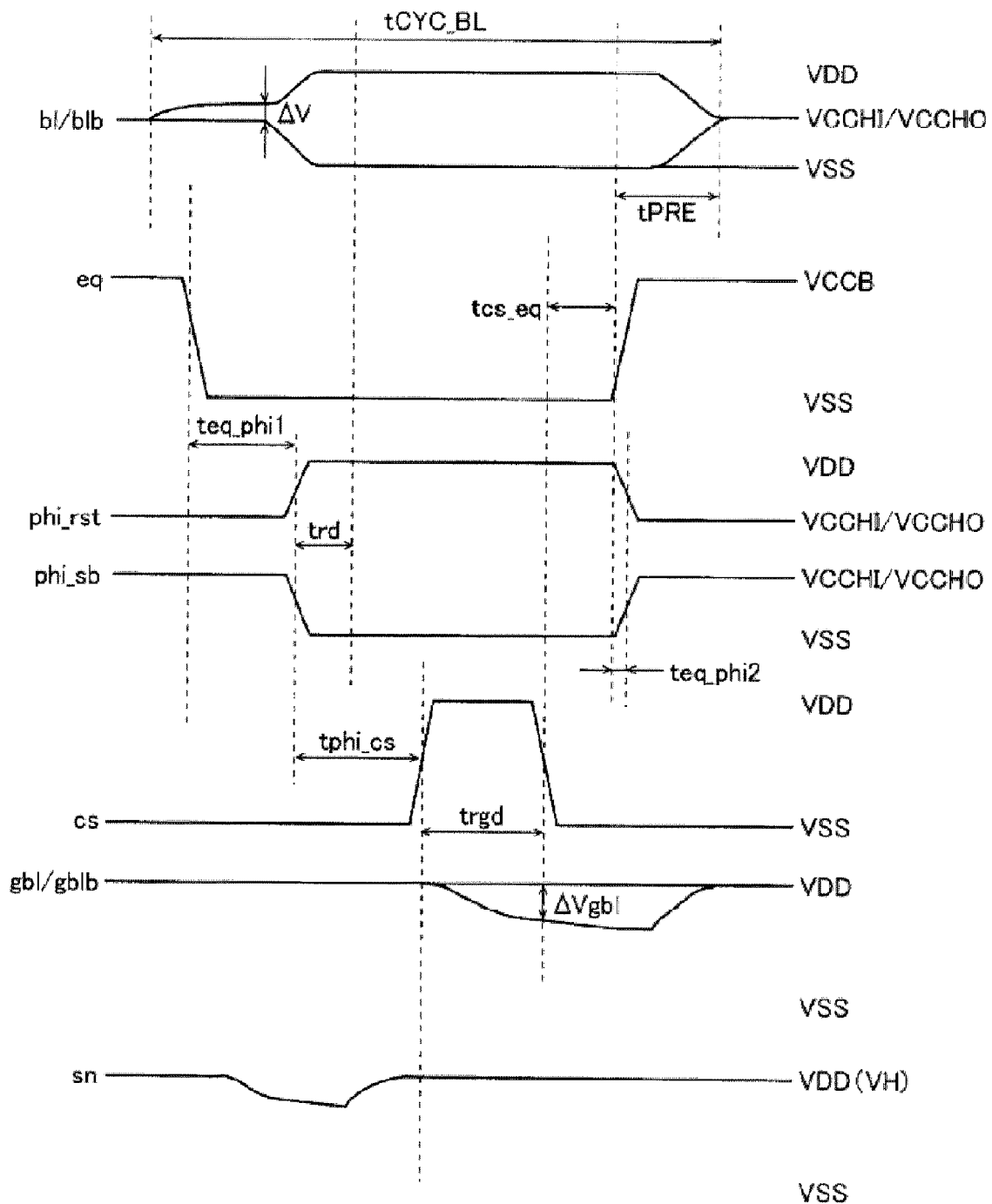
FIG. 6 is a timing chart for explaining a read operation of data "1".

FIG. 6 is a timing chart for explaining the read operation of the data "1," showing a voltage waveform of each of the first local bit line bl/second local bit line blb, the signal line eq, the signal line phi_rst, the signal line phi_sb, the signal line cs, the first global bit line gbl/second global bit line gblb, and the sense node sn in order from the top. Symbols regarding voltages and symbols regarding time in FIG. 6 are the same as those in FIG. 4, and therefore, an explanation thereof will not be repeated.

Operation of reading of data "1" from the memory cell BLCELL<0> will be described below with reference to FIG. 6. Since both of the transistors N5 and N6 remain turned on while the voltage of the signal line eq is in the high level, both of the first local bit line bl and the second local bit line blb make electrical conduction with the signal line phi_sb and are applied with a predetermined pre-charge voltage VCCHI.

Thereafter, since the select transistor PG<0> is turned on when the word line WL<0> has a low level, the sense node sn of the capacitor C<0> makes an electrical conduction with the first local bit line bl. In addition, since both of the transistors N5 and N6 are turned off when the signal line eq falls from the high level to the low level, the first local bit line bl and the second local bit line blb are separated from the signal line phi_sb and enter into a floating state.

At this time, a high voltage VH, which is close to the VDD, corresponding to the data "1" is applied to the sense node sn of the capacitor C<0>. Accordingly, due to a capacitance division of the capacitor C<0> and the first local bit line bl, a voltage increase ΔV occurs in the first local bit line bl and a voltage decrease occurs in the sense node sn of the capacitor C<0>. In the meantime, the voltage of the second local bit line blb remains at the pre-charge voltage VCCHI.

Thereafter, when the signal line phi_rst rises from the low level to the high level and the signal line phi_sb falls from the high level to the low level, the local sense amplifier BLSA enters into an active state. As a result, the voltage of the first local bit line bl can rise to the source voltage VDD and the voltage of the second local bit line blb can fall to the ground voltage VSS. That is, a voltage difference between the first local bit line bl and the second local bit line blb is amplified from ΔV to VDD−VSS by the local sense amplifier BLSA. At this time, the sense node sn of the capacitor C<0> returns to the high voltage VH corresponding to data "1." In addition, both of the first global bit line gbl and the second global bit line gblb remain at the high level in preparation for the read operation of the data.

Thereafter, since both of the transistors N3 and N4 are turned on when the signal line cs rises from the low level to the high level, an electrical conduction is made between the first local bit line bl and the first global bit line gbl and between the second local bit line blb and the second global bit line gblb. As a result, the voltage of the first global bit line gbl decreases from the source voltage VDD by ΔVgbl. On the other hand, the voltage of the second local bit line blb remains at the source voltage VDD. Accordingly, as it is determined in the sense amplifier SA that the voltage of the first global bit line gbl is larger than the voltage of the second global bit line gblb, the data "1" is read from the memory cell BLCELL<0>.

Thereafter, since both of the transistors N3 and N4 are turned off when the signal line cs falls from the high level to the low level, an electrical isolation is made between the first local bit line bl and the first global bit line gbl and between the second local bit line blb and the second global bit line gblb. In addition, when the signal lines phi_rst/phi_sb transition to the low level/high level, respectively, the local sense amplifier BLSA enters into an inactive state. In addition, since both of the transistors N5 and N6 are turned on when the signal line eq rises from the low level to the high level, both of the first local bit line bl and the second local bit line blb make an electrical conduction with the signal line phi_sb and are applied with the predetermined pre-charge voltage VCCHI. In addition, both of the first global bit line gbl and the second global bit line gblb go to the high level in preparation for the pre-charging operation.

Through the series of above-described operations, the data "1" can be read from the memory cell BLCELL<0>. In addition, although it has been illustrated in the above that the memory cell BLCELL<0> is selected for reading the data "1," the above-described operations may be equally applied to other selected memory cell BLCELL<k>, and if necessary, a relationship between the first local bit line bl and the second local bit line blb and a relationship between the first global bit line gbl and the second global bit line gblb may be reversed.

<Layout Pattern>

Figure 7:
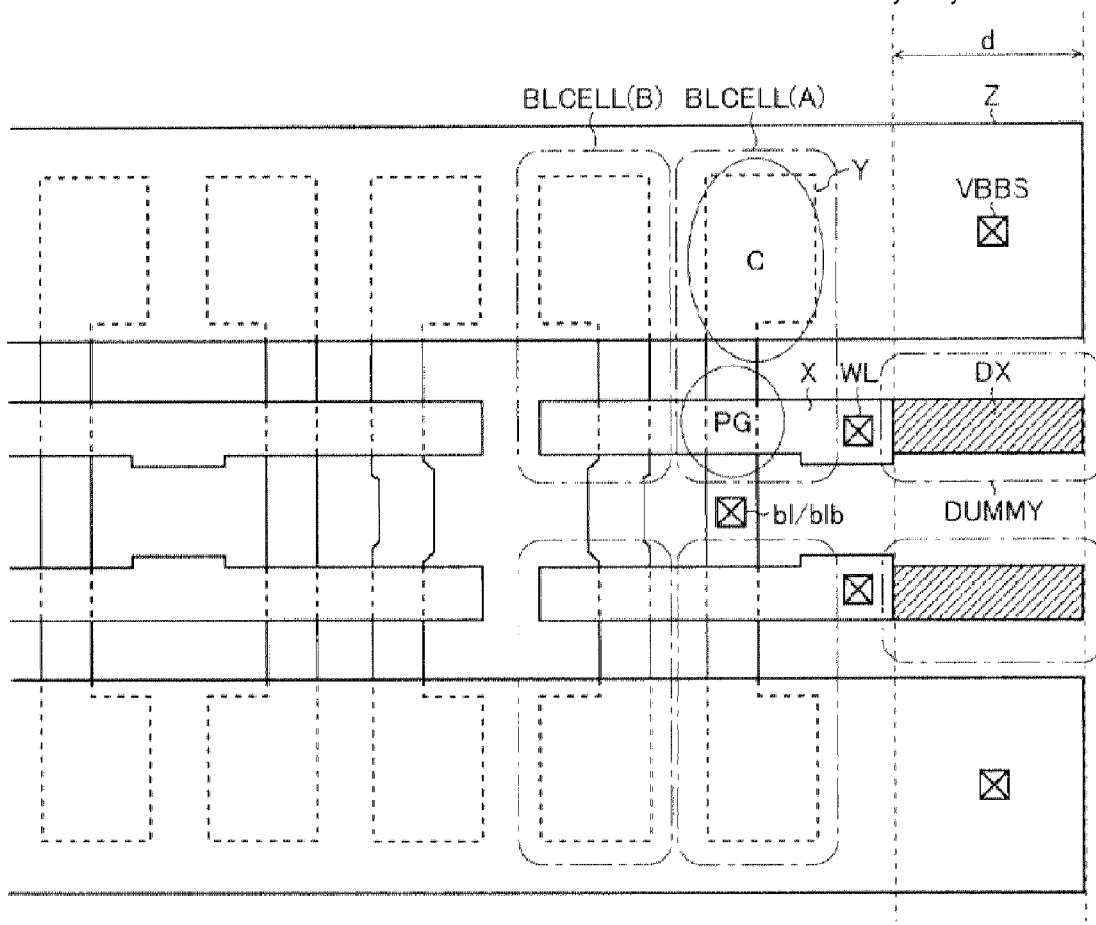
FIG. 7 shows a layout pattern of memory cells BLCELL of DRAM.

FIG. 7 shows a layout pattern of memory cells BLCELL. As shown in FIG. 2, each of the memory cells BLCELL includes the select transistor PG and the capacitor C. In FIG. 7, reference numeral X denotes a gate of the select transistor PG and reference numeral Y denotes an active region formed on a semiconductor substrate. Reference numeral Z denotes a contact wiring used to apply the reference voltage VBBS to the capacitor C. A contact to which the reference voltage VBBS is applied is disposed in the outside of an end portion of the memory array so that the contact can be formed as stably as possible. Accordingly, the contact wiring Z extends to a position spaced by a predetermined distance d from the end portion of the memory array. The gate X of the select transistor PG is disposed to be parallel to the contact wiring Z.

In the semiconductor memory device 1, in order to prevent a density difference of a mask pattern and a characteristic variation due to the density difference among a memory cell BLCELL(A), which is arranged in the end portion of the memory array (the portion adjacent to a peripheral perimeter of the memory array), and a memory cell BLCELL(B), which is not arranged in the end portion of the memory array, a dummy block DUMMY which is not in practical use is arranged adjacent to the memory cell BLCELL(A).

Here, the dummy block DUMMY is configured to include a dummy gate DG formed by extending only a gate G of the select transistor PG to a position spaced from the end portion of the memory array by the predetermined distance d at the maximum. Thus, when an empty space formed between the contact wirings Z of the capacitors C is utilized to provide the dummy gate DG formed by extending only the gate G of the select transistor PG, an area of the memory array is not increased at all and the density difference of the mask pattern can be reduced, which may result in improvement of an operation speed and a yield of the semiconductor memory device 1.

The provision of the dummy block DUMMY can reduce characteristic variations of the selected transistors PG<0> and PG<1> shown in FIG. 2, for example, and improve a precision of threshold voltages thereof. This can prevent unnecessary increase of a difference between the low voltage VL and the ground voltage VSS shown in the voltage waveform of the sense node sn in FIG. 3, and further, a sufficient ΔV to operate the DRAM may be stably obtained.

Figure 9:
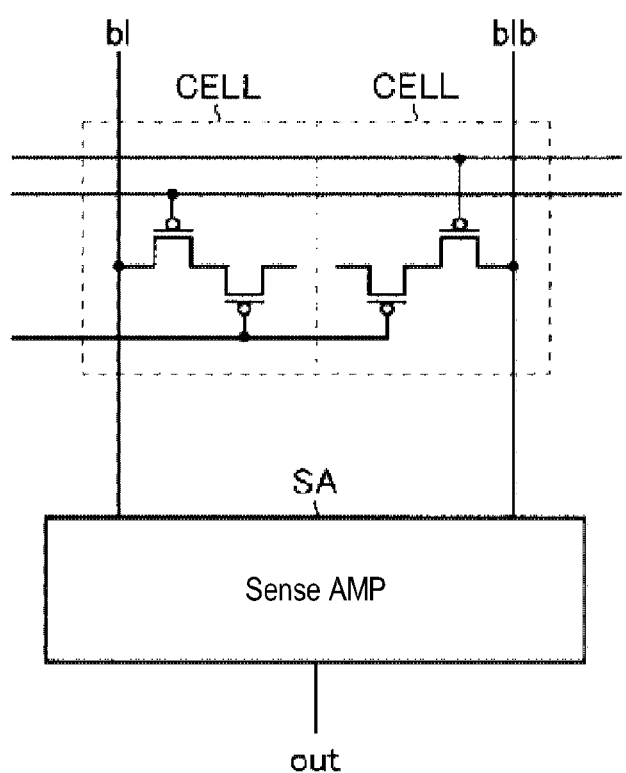
FIG. 9 is a circuit diagram showing a DRAM according to an embodiment.

The layout pattern can be applied to the memory cell unit CELL in FIG. 9, as well as the memory cell unit CELL in FIG. 2.

Figure 14:
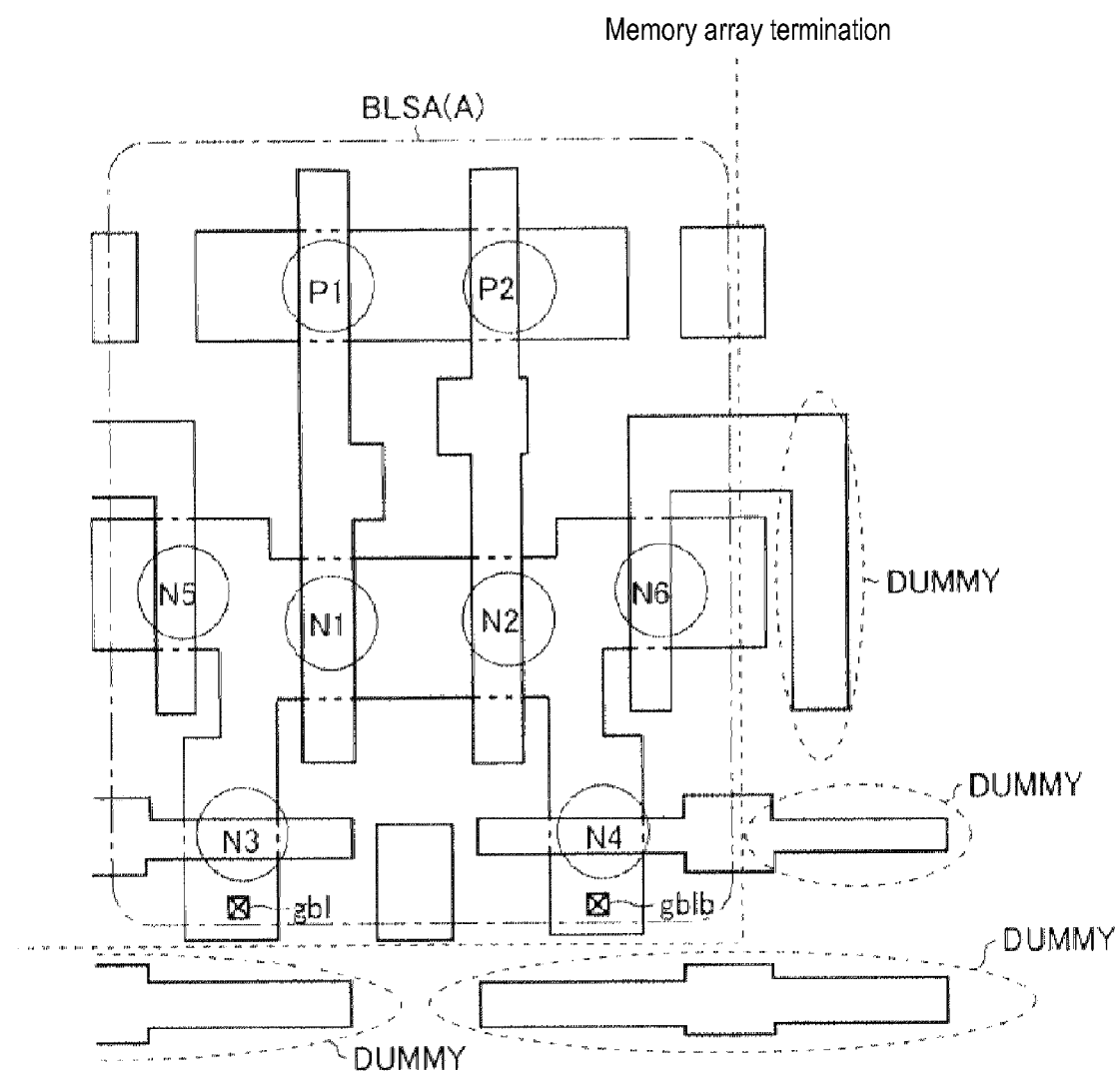
FIG. 14 shows a layout pattern of a local sense amplifier BLSA.

FIG. 14 shows a layout pattern of the local sense amplifier BLSA according to an embodiment. As shown in FIG. 2, the local sense amplifier BLSA includes 8 transistors P1, P2 and N1 to N6.

In the semiconductor memory device 1, in order to prevent a density difference of a mask pattern and a characteristic variation due to the density difference among a local sense amplifier BLSA(A), which is arranged in the end portion of the memory array (the portion adjacent to the peripheral perimeter of the memory array), and a local sense amplifier BLSA(B), which is not arranged in the end portion of the memory array termination, a dummy block DUMMY, which is not in practical use is arranged adjacent to the local sense amplifier BLSA(A).

Here, the dummy block DUMMY has a layout pattern designed to have a line symmetry relationship with a portion of a layout pattern of the local sense amplifier BLSA(A) with a boundary line between the dummy block and the local sense amplifier BLSA(A) as a symmetrical axis. In particular, the dummy block DUMMY is configured to have a mirroring form of only gates of transistors arranged in one row or one column (transistors N3, N4 and N6 in FIG. 14) among the 8 transistors forming the local sense amplifier BLSA(A). Accordingly, an area of the memory array may be prevented from being increased, and reduce the density difference of the mask pattern, which may result in an improvement of an operation speed and a yield of the semiconductor memory device 1.

Further, the provision of the dummy block DUMMY can reduce characteristic variations of the transistors P1, P2, N1, N2, N5 and N6 shown in FIG. 2, for example. The reduction of the characteristic variations of the transistors P1, P2, N1 and N2 can prevent the time denoted by the reference numeral trd in FIG. 3 from being unnecessarily lengthened. In addition, the reduction of the characteristic variations of the transistors N5 and N6 can prevent the time denoted by the reference numeral tPRE in FIG. 3 from being unnecessarily lengthened.

Figure 8:
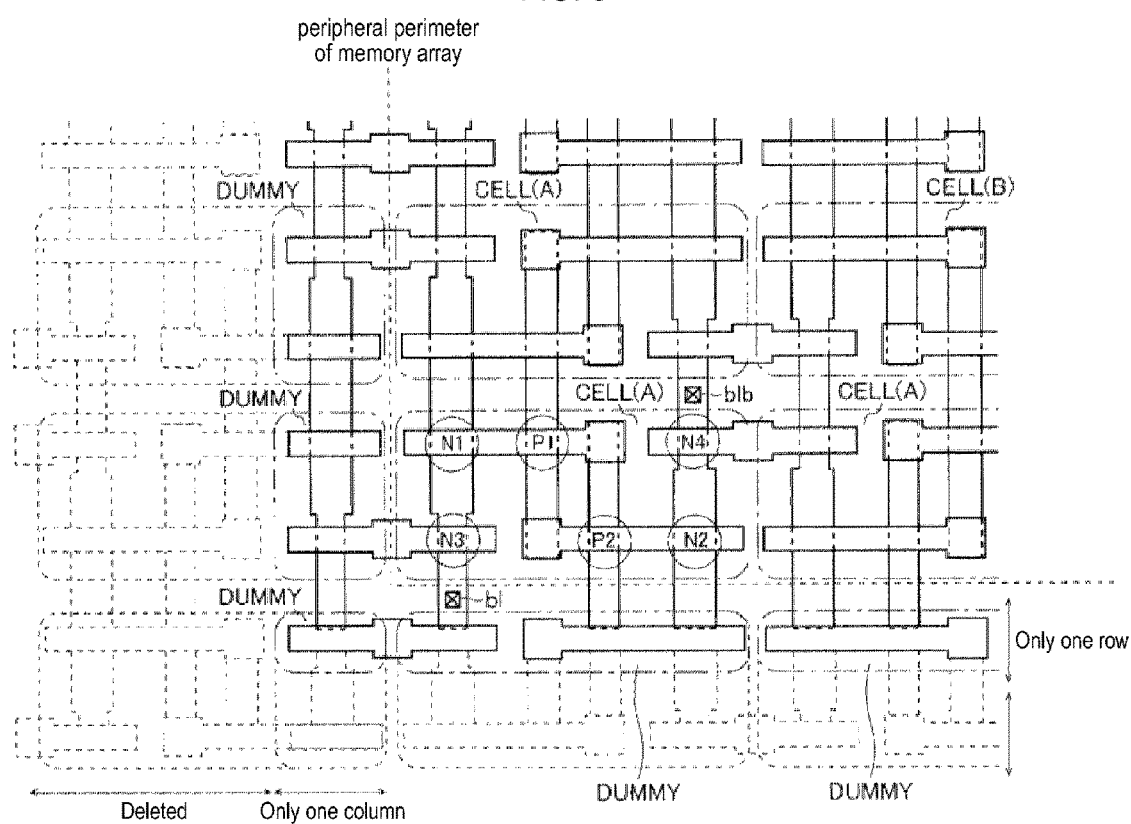
FIG. 8 shows a layout pattern of memory cell units of 6T-SRAM.
Figure 10:
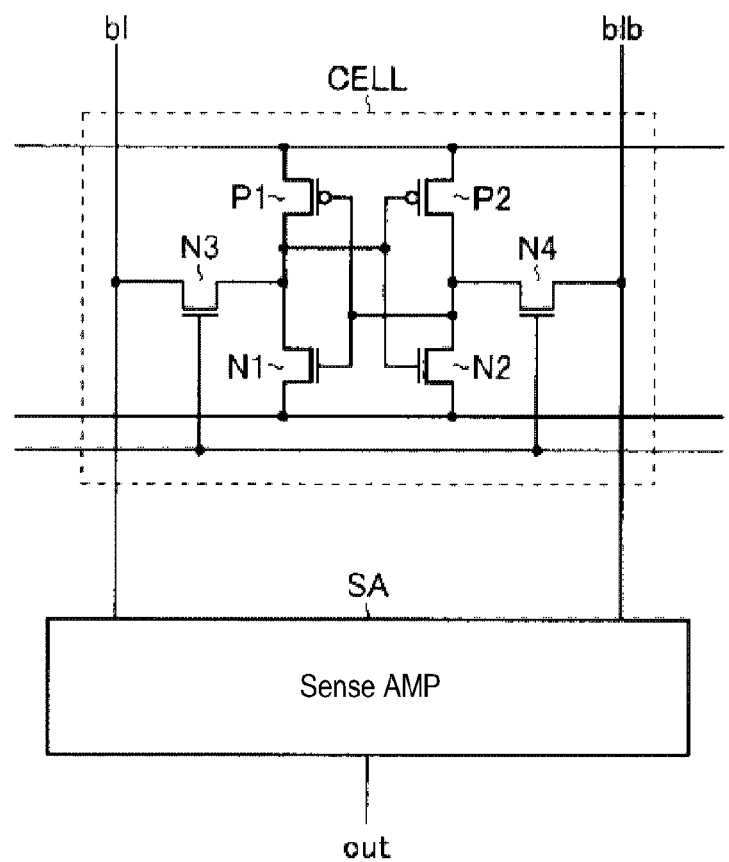
FIG. 10 is a circuit diagram showing one example of configuration of 6T-SRAM.

FIG. 8 shows a layout pattern of memory cell units of 6T-SRAM. As shown in FIG. 10, a memory cell unit CELL of 6T-SRAM includes 6 transistors P1, P2 and N1 to N4. The transistors are arranged in the form of a lattice (2×3) as shown in FIG. 8.

In the semiconductor memory device 1, in order to prevent a density difference of a mask pattern and a characteristic variation due to the density difference among a memory cell unit CELL(A), which is arranged in the end portion of the memory array (the portion adjacent to the peripheral perimeter of the memory array), and a memory cell unit CELL(B), which is not arranged in the end portion of the memory array, a dummy block DUMMY, which is not in practical use is arranged adjacent to the memory cell unit CELL(A).

Here, the dummy block DUMMY has a layout pattern designed to have a line symmetry relationship with a portion of a layout pattern of the memory cell unit CELL(A) with a boundary line between the dummy block and the memory cell unit CELL(A) as a symmetrical axis. In particular, the dummy block DUMMY is configured to have a mirroring form of only transistors arranged in one row or one column among the 6 transistors forming the memory cell unit CELL(A). Accordingly, an area of the memory array may be prevented from being increased, and reduce the density difference of the mask pattern, which may result in an improvement of an operation speed and a yield of the semiconductor memory device 1.

Figure 11:
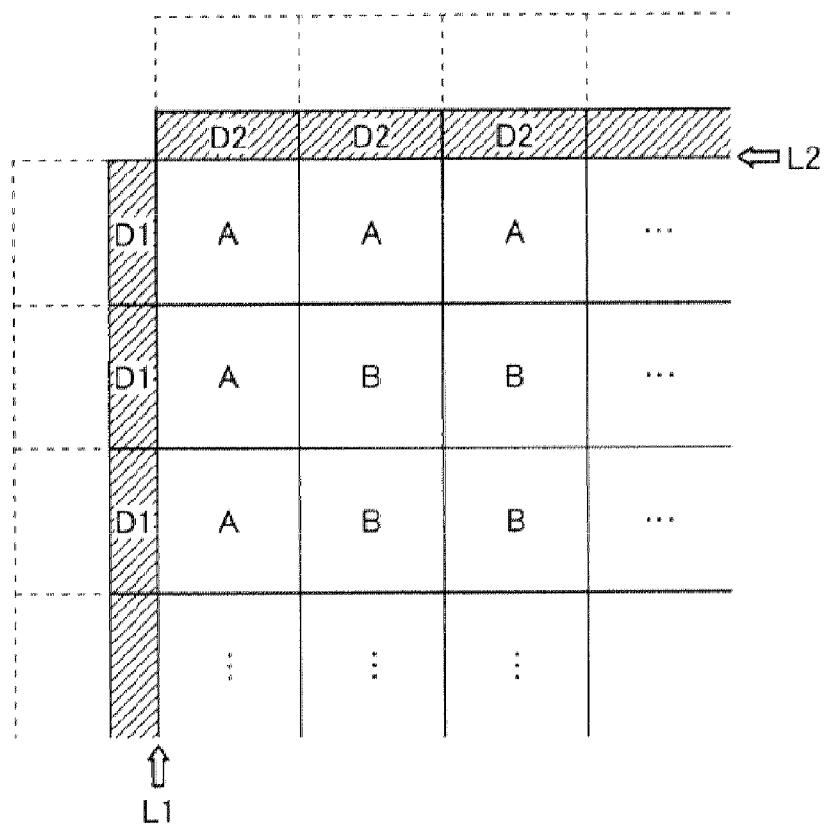
FIG. 11 is a schematic view showing a layout pattern of an end portion of a memory array.
Figure 12:
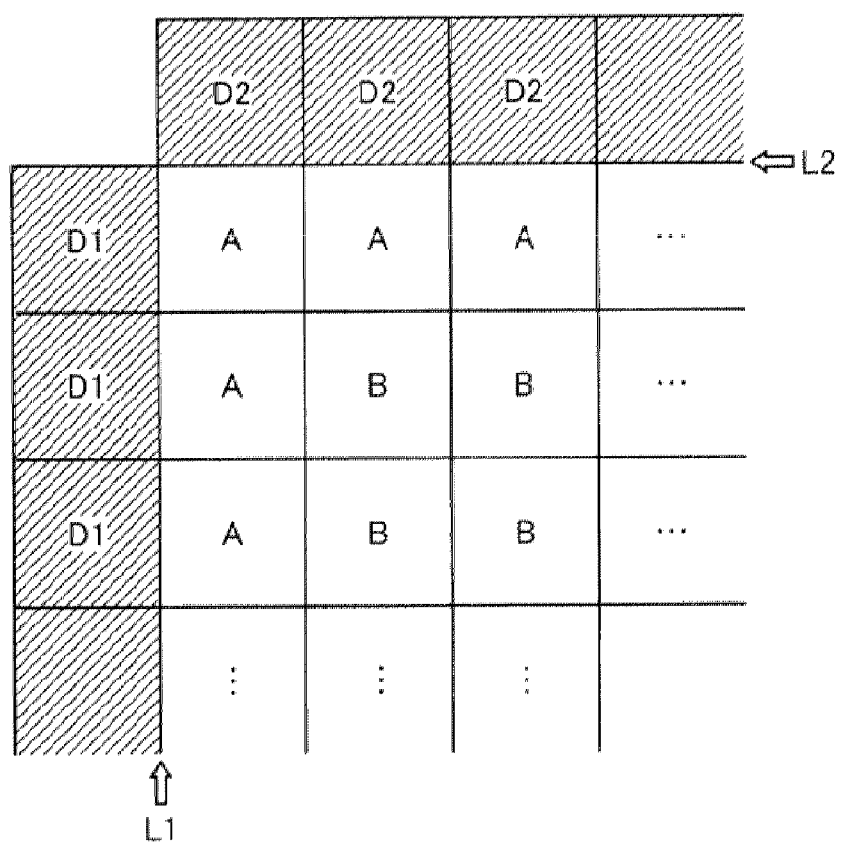
FIG. 12 is a schematic view showing a conventional layout pattern of an end portion of a memory array.

FIG. 11 is a schematic view showing a layout pattern of an end portion of the memory array. As shown in FIG. 11, the semiconductor memory device 1 includes a memory array including a plurality of element blocks A and B, and dummy blocks D1 and D2, which are disposed adjacent to the element blocks A. These dummy blocks D1 and D2 are arranged in the end portion of the memory array, and are not in practical use. Further, the layout pattern of the dummy blocks D1 and D2 is configured to correspond to only a portion of a layout pattern of the element blocks A. Such a configuration can reduce characteristic variations due to a density difference of a mask pattern without unnecessarily increasing an area of the memory array.

Figure 13:
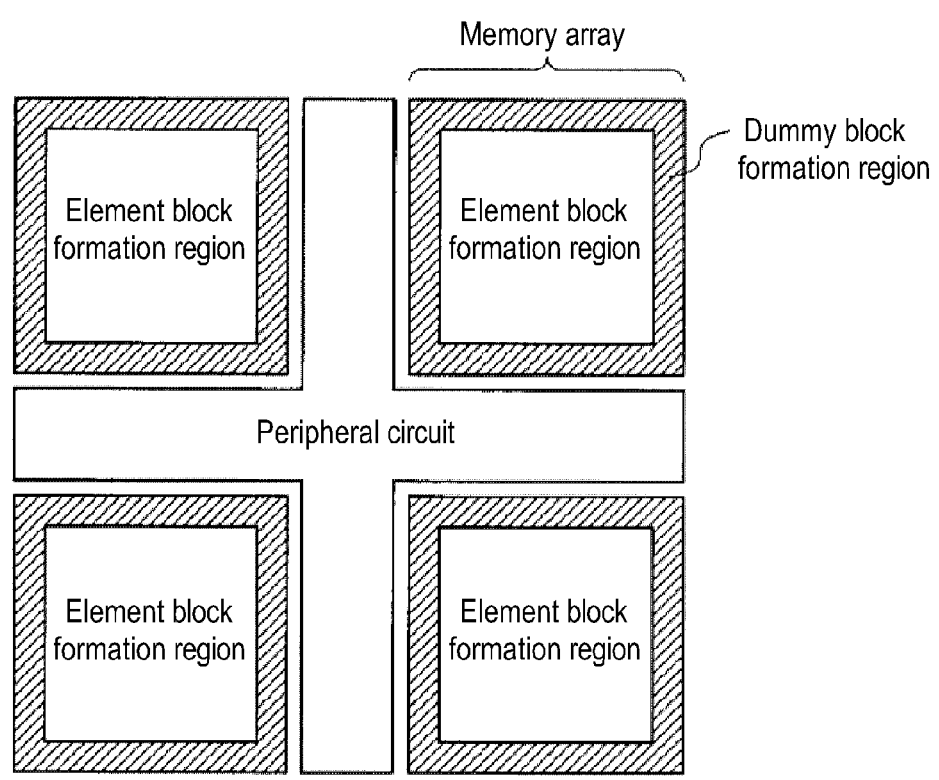
FIG. 13 is a schematic view showing arrangement of a plurality of divided memory arrays.

In particular, when a plurality of divided memory arrays is arranged as shown in FIG. 13, effects of reducing the area of the memory array becomes more apparent since an area for forming the dummy blocks D1 and D2 increases with an increase of an area of the end portions of the memory arrays.

According to the present disclosure in some embodiments, it is possible to provide a semiconductor memory device which is capable of reducing a characteristic variation due to a density difference of a mask pattern without unnecessarily increasing an area of a memory array.

The present disclosure can be suitably utilized as a technique for reducing a characteristic variation due to a density difference of a mask pattern without unnecessarily increasing an area of a memory array included in a semiconductor memory device (including a memory-mounted LSI).

While certain embodiments have been described, these embodiments have been presented by way of example only, and are not intended to limit the scope of the disclosures. Indeed, the novel methods and devices described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor memory device comprising:
    a memory array including a plurality of element blocks, the plurality of element blocks including end-portion element blocks arranged at an end portion of the memory array; and
    at least one dummy block disposed adjacent to the end-portion element blocks, the at least one dummy block being not in practical use,
    wherein a layout pattern of transistor in the at least one dummy block is configured to correspond to only a portion of a layout pattern of transistor in the plurality of element blocks.

2. The semiconductor memory device of claim 1, wherein each of the plurality of element blocks is a sense amplifier or a memory cell including 6 transistors arranged in the form of a lattice and the at least one dummy block is configured to correspond to a layout pattern of transistors arranged in one row or one column of the lattice adjacent to the dummy block.

3. The semiconductor memory device of claim 2, wherein the at least one dummy block has a layout pattern designed to have a line symmetry relationship with the portion of the layout pattern of the plurality of element block with a boundary line between the at least one dummy block and the plurality of element blocks as a symmetrical axis.

4. The semiconductor memory device of claim 1, wherein the memory array includes a plurality of divided memory arrays.

5. The semiconductor memory device of claim 1, wherein each of the plurality of the element blocks is a sense amplifier or a memory cell including 6 transistors arranged in the form of a lattice and the at least one dummy block is configured to correspond to a layout pattern of gates of transistors arranged in one row or one column of gates of the lattice adjacent to the dummy block.

6. The semiconductor memory device of claim 1, wherein a size of the at least one dummy block is smaller than a size of each of the plurality of element blocks.

7. The semiconductor memory device of claim 1, wherein each of the end-portion element blocks is a memory cell including 6 transistors arranged in the form of a lattice, and wherein the at least one dummy block has a mirroring form of only transistor arranged in one row or one column among the transistors of the end-portion element blocks.

* * * * *